United States Patent [19]

Crotzer

[11] Patent Number: 5,599,193
[45] Date of Patent: Feb. 4, 1997

[54] RESILIENT ELECTRICAL INTERCONNECT

[75] Inventor: David R. Crotzer, Windham, N.H.

[73] Assignee: Augat Inc., Mansfield, Mass.

[21] Appl. No.: 294,370

[22] Filed: Aug. 23, 1994

[51] Int. Cl.⁶ ..................................... H01R 9/09
[52] U.S. Cl. ................................ 439/66; 439/91
[58] Field of Search ......................... 439/66, 91, 591

[56] References Cited

U.S. PATENT DOCUMENTS

| | | |
|---|---|---|
| 3,100,933 | 8/1963 | Hancock et al. |
| 3,203,083 | 8/1965 | Obenhaus. |
| 3,482,726 | 12/1969 | Schroeder, Jr. |
| 3,555,664 | 1/1971 | Bingham et al. |
| 3,632,319 | 1/1972 | Hoppin et al. .......................... 29/487 |
| 3,680,037 | 7/1972 | Nellis et al. ............................ 439/66 |
| 3,700,427 | 10/1972 | Hoppin, III et al. .................. 75/0.5 R |
| 3,818,415 | 6/1974 | Evans et al. .......................... 339/17 F |
| 3,880,486 | 4/1975 | Avakian ................................. 439/66 |
| 3,921,885 | 11/1975 | Knox .................................... 228/116 |
| 3,998,513 | 12/1976 | Kobayashi et al. ................... 439/91 |
| 4,012,117 | 3/1977 | Lazzery ................................. 359/83 |
| 4,027,936 | 6/1977 | Nemoto et al. ....................... 439/91 |
| 4,548,451 | 10/1985 | Benarr et al. ........................ 439/66 |
| 4,563,725 | 1/1986 | Kirby .................................... 361/388 |
| 4,593,961 | 6/1986 | Cosmo ................................ 339/61 M |
| 4,606,778 | 8/1986 | Jahnke ................................ 148/11.5 N |
| 4,666,226 | 5/1987 | Legrand et al. ..................... 339/61 M |
| 4,688,150 | 8/1987 | Peterson ............................... 361/403 |
| 4,698,275 | 10/1987 | Holt ........................................ 428/40 |
| 4,737,112 | 4/1988 | Jin et al. .............................. 439/66 |
| 4,754,546 | 7/1988 | Lee et al. ............................... 29/877 |
| 4,758,927 | 7/1988 | Berg ..................................... 361/401 |
| 4,778,950 | 10/1988 | Lee et al. .......................... 174/356 C |
| 4,814,040 | 3/1989 | Ozawa .................................. 156/634 |
| 4,847,136 | 7/1989 | Lo ........................................ 428/195 |
| 4,847,146 | 7/1989 | Yeh et al. ............................. 428/332 |
| 4,894,706 | 1/1990 | Sato et al. .............................. 357/72 |
| 4,939,568 | 7/1990 | Kato et al. .............................. 357/75 |
| 4,954,875 | 9/1990 | Clements ................................ 357/75 |
| 5,065,282 | 11/1991 | Polonio ................................ 361/399 |
| 5,088,009 | 2/1992 | Harada et al. .......................... 439/79 |
| 5,092,774 | 3/1992 | Milan ..................................... 439/66 |
| 5,106,308 | 4/1992 | Gollomp et al. ....................... 439/67 |
| 5,148,266 | 9/1992 | Khandros et al. ..................... 357/80 |
| 5,173,766 | 12/1992 | Long et al. ........................... 257/687 |
| 5,175,409 | 12/1992 | Kent ................................... 219/85.22 |
| 5,175,491 | 12/1992 | Ewers ................................. 324/158 F |
| 5,220,726 | 6/1993 | Mantell .................................. 29/885 |
| 5,237,203 | 8/1993 | Massaron ............................. 257/688 |
| 5,267,867 | 12/1993 | Agahdel et al. ....................... 439/73 |
| 5,270,571 | 12/1993 | Parks et al. .......................... 257/686 |
| 5,273,440 | 12/1993 | Ashman et al. ....................... 439/71 |
| 5,281,852 | 1/1994 | Normington ......................... 257/685 |
| 5,288,238 | 2/1994 | Ikenaka et al. ........................ 439/91 |
| 5,430,614 | 7/1995 | Difrancesco ........................... 439/74 |

*Primary Examiner*—Neil Abrams
*Attorney, Agent, or Firm*—Weingarten, Schurgin, Gagnebin & Hayes LLP

[57] ABSTRACT

An electrical interconnect is provided for connecting an integrated circuit or other electrical or electronic component to a circuit board or for interconnecting two or more circuit boards. The interconnect comprises a substrate having one or more resilient elements of a non-conductive material and having opposite contact surfaces. A flexible conductive coating is provided on the contact surfaces of the resilient elements and extends between the contact surfaces to provide electrical connection therebetween. In one embodiment each element is integrally formed with a resilient substrate and has electrically conductive contact surfaces which are outward of the respective substrate surfaces and are electrically connected through a conductive surface which extends through vias or openings formed in the substrate. In another embodiment, each element is individually formed and is disposed within a corresponding cavity of a separate substrate. In a further embodiment, each element is individually formed having different sections of different durometers so as to provide intended spring or resilience characteristics. A particulate layer can be provided on the conductive contact surfaces to provide a roughened surface by which an oxide layer on a mating electrical contact is penetrated to minimize contact resistance.

4 Claims, 7 Drawing Sheets

RESILIENT ELECTRICAL INTERCONNECT

FIELD OF THE INVENTION

This invention relates in general to electrical interconnect devices and more particularly to interconnect devices for integrated circuits and other electrical and electronic components and circuits.

BACKGROUND OF THE INVENTION

The evolution of integrated circuits has been toward increasingly smaller packages with an increasingly larger number of terminals for electrical interconnection between the integrated circuit and the circuit board on which it resides. As the number of terminals per integrated circuit has increased, the leads themselves have become finer and more closely spaced, thereby increasing the difficulty in mounting these fine lead integrated circuits to the circuit board.

One method of overcoming this difficulty is to replace the leads, which are typically located about the perimeter of the integrated circuit package, with contacts located on the bottom surface of the integrated circuit package to form a leadless integrated circuit package. These contacts are typically shaped as small protuberances or "balls" located in a grid array. The integrated circuit package having these surface contacts is then placed within a leadless integrated circuit socket or mounting device which holds the integrated circuit package in place. The mounting device has an array of electrical contacts which align with the ball contacts of the grid array on the integrated circuit package to provide electrical continuity between the circuit board upon which the mounting device is located and the integrated circuit package.

One problem that arises, not only with leadless but with leaded integrated circuit packages, is that the electrical contacts of the mounting device and the integrated circuit package become oxidized which results in increased contact resistance and therefore decreased conduction between the integrated circuit package contacts and the socket contacts. The act of inserting the leads of an integrated circuit package into a socket or the flux used in soldering the leads of the integrated circuit package to a circuit board typically removes at least some of this oxide, thereby providing a better electrical contact. However, since leadless integrated circuit packages are not inserted into a mounting device in a manner conductive to removal of the oxide on the contacts, and since leadless integrated circuit packages are not soldered to the mounting device, the accumulation of oxide on the contacts can result in a poor electrical connection.

SUMMARY OF THE INVENTION

The invention provides an electrical interconnect for an integrated circuit or other electrical or electronic component by which the component is electrically connected to a circuit board. The invention is also useful for providing electrical interconnection between corresponding contacts of two or more circuit boards to be interconnected. The invention comprises a substrate having respective opposite surfaces and one or more resilient elements which are of a nonconductive material and each having respective opposite contact surfaces. A flexible conductive coating or layer is provided on the contact surfaces of the one or more resilient elements and extends between the contact surfaces to provide electrical connection therebetween. Each element thereby provides an electrical interconnection between its upper and lower contact surfaces to thereby provide electrical connection to terminals or contacts of devices, circuit boards or the like in contact with those surfaces.

In one embodiment, each element is integrally formed with a resilient substrate and has contact surfaces which are outward of the respective substrate surfaces. At least one opening or via extends between the respective surfaces of the substrate proximate to the element, and the flexible conductive layer or coating is provided along the wall of the element through the via and joined to the contact surfaces of the element. Preferably, the contact surfaces of each element have a particulate layer which provides a roughened surface by which an oxide layer on the electrical contacts which come into engagement with the element is penetrated to minimize contact resistance.

In another embodiment, a rigid substrate has separate resilient elements disposed in respective cavities of the substrate. The elements each have respective contact surfaces which are provided by a conductive coating or layer which extends along the wall of the element to electrically interconnect the contact surfaces.

The resilient elements with their conductive contact areas can be upstanding or outward of the respective substrate surfaces to provide protuberances for mating with corresponding contacts of a component device or circuit board being interconnected. Alternatively, the resilient elements can have their contact surfaces substantially in the plane of the corresponding substrate surfaces for mating with corresponding contacts of a mating device or element.

The novel interconnect in one implementation is employed in a leadless integrated circuit or other device socket with each element sized and configured to engage a corresponding contact of the integrated circuit disposed in the socket. The elements can be provided of sufficiently small size and spacing to be formed into a grid array for engaging the fine "leads" or "balls" of a grid array device.

In another implementation, the novel interconnect can be employed to provide board-to-board interconnection. In this version, the interconnect is part of a mounting device capable of providing engagement between two generally parallel circuit boards and for providing electrical interconnection between the corresponding contacts or terminals on the boards. Similar interconnect arrangements can be provided for more than two circuit boards to be interconnected.

The flexible conductive layer or coating is provided by any technique capable of providing a flexible or resilient metallized or conductive coating on the material forming the resilient elements. For an element of silicone rubber or other similar elastomeric material, the coating is preferably provided by a chemical grafting technique by which metallization is provided on the contact surface of each element and on the side of the element wall interconnecting the contact surfaces. The conductive coating can also be applied by techniques such as dipping, plating, vacuum deposition, vapor deposition, screen printing, sputtering, plasma spray or spray coating. These techniques are themselves known in the art for providing a conductive coating onto a nonconductive surface.

DESCRIPTION OF THE DRAWINGS

This invention is pointed out with particularity in the appended claims. The above and further advantages of this invention may be better understood by referring to the following description taken in conjunction with the accompanying drawing, in which:

DETAILED DESCRIPTION OF THE INVENTION

Figure 1:
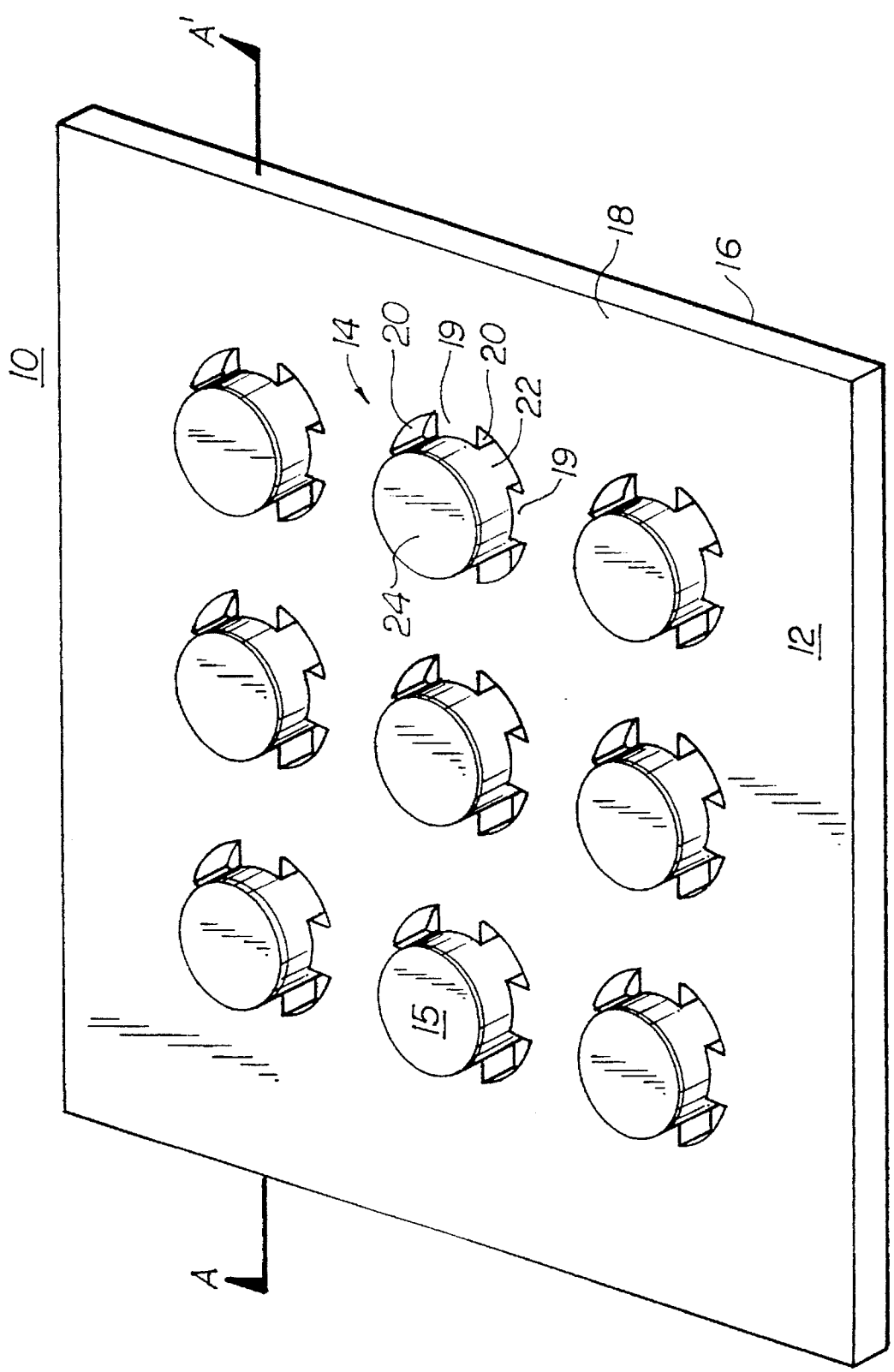
FIG. 1 is a perspective view of an embodiment of an electrical interconnect according to the invention.
Figure 2:
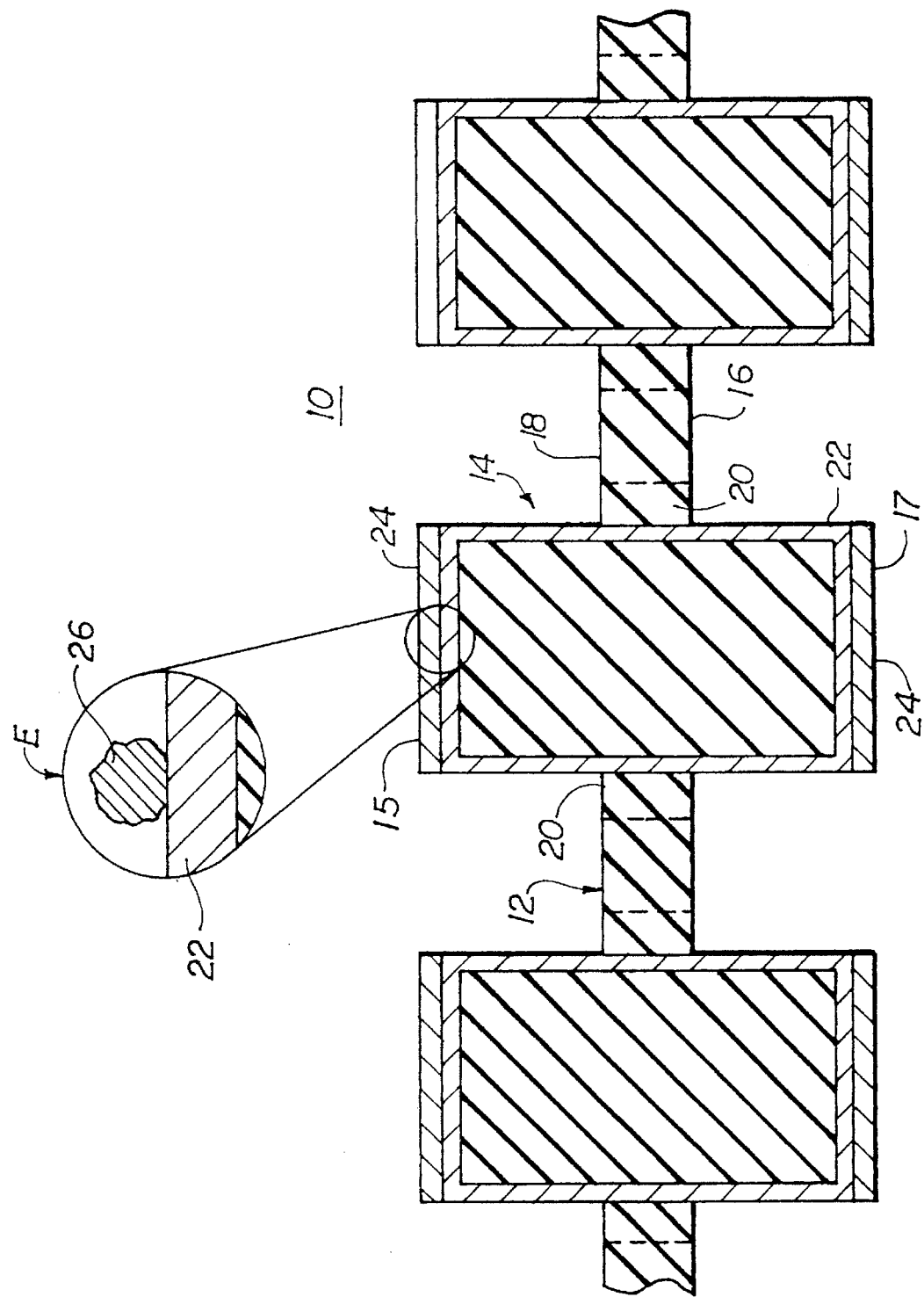
FIG. 2 is a cross-sectional view taken along section A–A' of FIG. 1.

Referring to FIGS. 1 and 2, an electrical interconnect 10 constructed in accordance with this invention includes a substrate 12 having a plurality of integrally formed elements 14 extending outward from both surfaces 16, 18 of the substrate 12. Adjacent each element 14 is at least one via or opening 20 extending from the first surface 16 to the second surface 18 of the substrate 12. Each element 14 is connected to the substrate 12 by at least one bridge 19. In the illustrated embodiment, each element has four bridges 19 spaced by four vias 20. In one embodiment the durable substrate 12 is a silicone rubber having 40–90 durometers as measured on a Shore A scale. Although silicone rubber is used in this embodiment, other elastomeric materials may be used.

Each element 14 has a conductive surface 22 which extends through the vias 20 and provides an electrical conduction path from a top surface 15 of the element 14 through the vias 20 to the bottom surface 17 of the element 14. The larger the amount of increased amount of conductive surface 22 area. Although the elements are shown as cylindrical in shape, other shapes may be formed, as described below.

Additionally, the top and bottom surfaces of each element 14 have an additional particulate layer 24. The particular layer 24, shown expanded in portion E of FIG. 2, provides a roughened surface by which any oxide layer on electric contacts which come into contact with the surfaces of the elements is penetrated. The roughed surface is provided by hard particles 26 applied to the top and bottom surfaces. The particles are conductive and homogeneous and are of greater hardness than the hardness of the mating contact surfaces. In one embodiment the particles are carborundum having a metal such as copper, or other conductive material. A hardness typically in the range of about 100–7000 on the Knoop scale are suitable. The particles 26 can be plasma injected onto the surface coating 22.

The conductive coating or layer 22 is sufficiently flexible and resilient to not impede the resilience of the elements 14. The elements 14 can compress when in contact with mating electrical contacts and expand when out of mating contact without peeling or cracking of the conductive coating 22 on the walls of elements 14. The contact surfaces 15 and 17 may also flex by reason of engagement with a non-plane or uneven mating surface. The conductive coating or layer can be provided to have the same flexible characteristic throughout its extent. However, for some purposes, the conductive coating need not be resilient on the contact surfaces 15 and 17, but only on the wall surface of the elements. For example, a conductive coating or layer may be clad onto the contact surfaces 15 and 17 and be relatively non-flexible, and chemically grafted onto the wall surfaces of elements 14 to be flexible and resilient. Or the conductive coating can be grafted onto the wall and contact surfaces of the elements.

Figure 3:
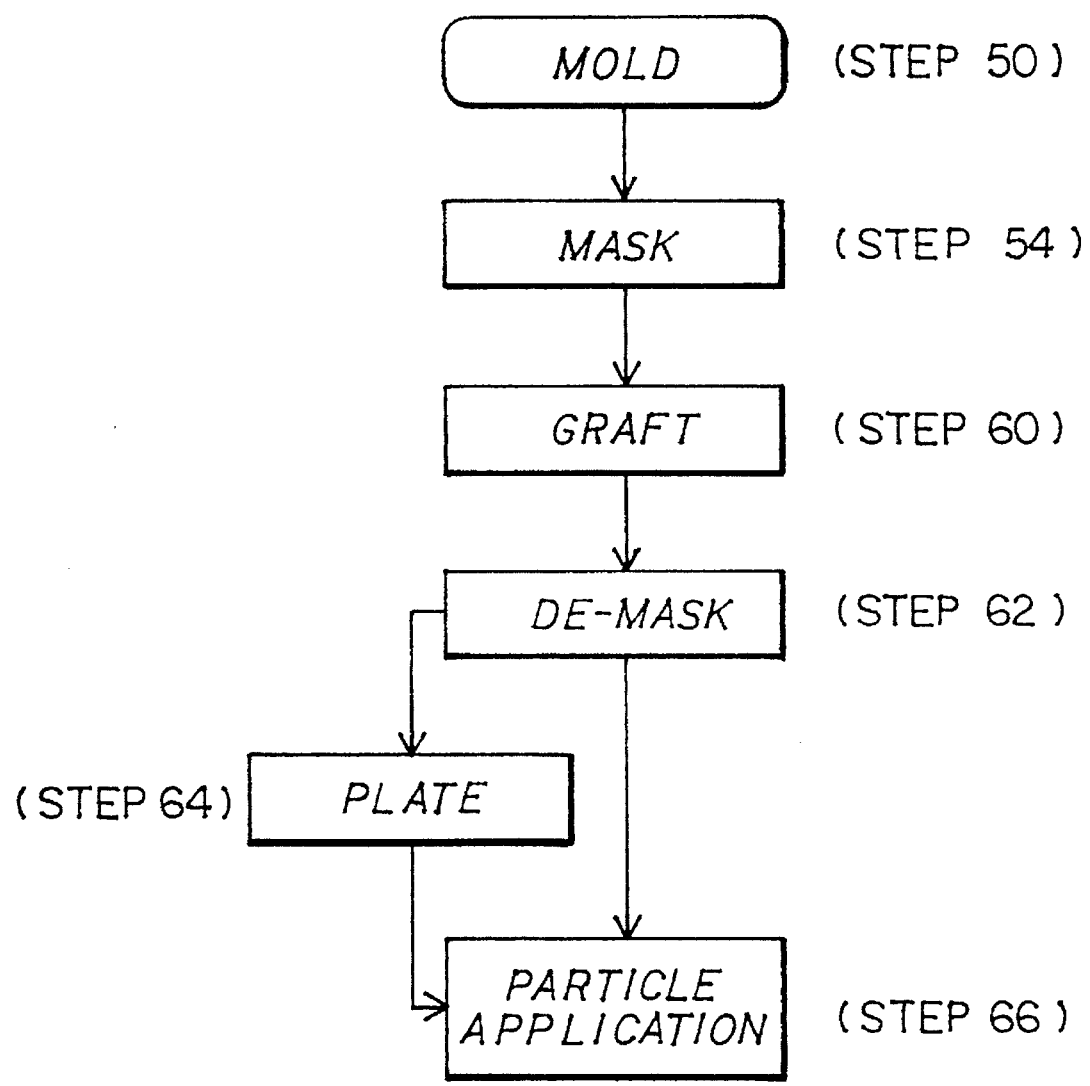
FIG. 3 is a flow chart depicting the method of fabricating the interconnect of FIG. 1.

Referring to FIG. 3, a method for making an interconnect begins with the molding (Step 50) of the substrate 12 into the desired shape, including the elements 14 and vias 20. The surfaces 16, 18 of the substrate 12 are masked (Step 54), leaving the surfaces of the elements 14 and the vias 20 exposed. In one embodiment, the mask is a mechanical metal mask of typically Teflon coated stainless steel, clamped onto the surface of the substrate. Other known masking techniques such as photolithography may be used.

The exposed elements 14 and the vias 20 then undergo chemical grafting (Step 60). The chemical grafting onto the substrate results in microscopic "whiskers" of metal extending from the surface of the element. The grafting technique is described in an article entitled Grafting of Polymer by Purely Chemical Means, Polymer News, Volume II, No. 11/12, pages 19–25, incorporated herein by reference.

The mask is then removed (Step 62) and copper or other metal may optionally be electroless plated (Step 64) onto the metal which was chemically grafted onto surfaces of the elements 14 and vias 20. The particulate layer 24 is then applied on the surfaces of the elements 14 plasma injection of particles of carborundum (Step 66).

Figure 4:
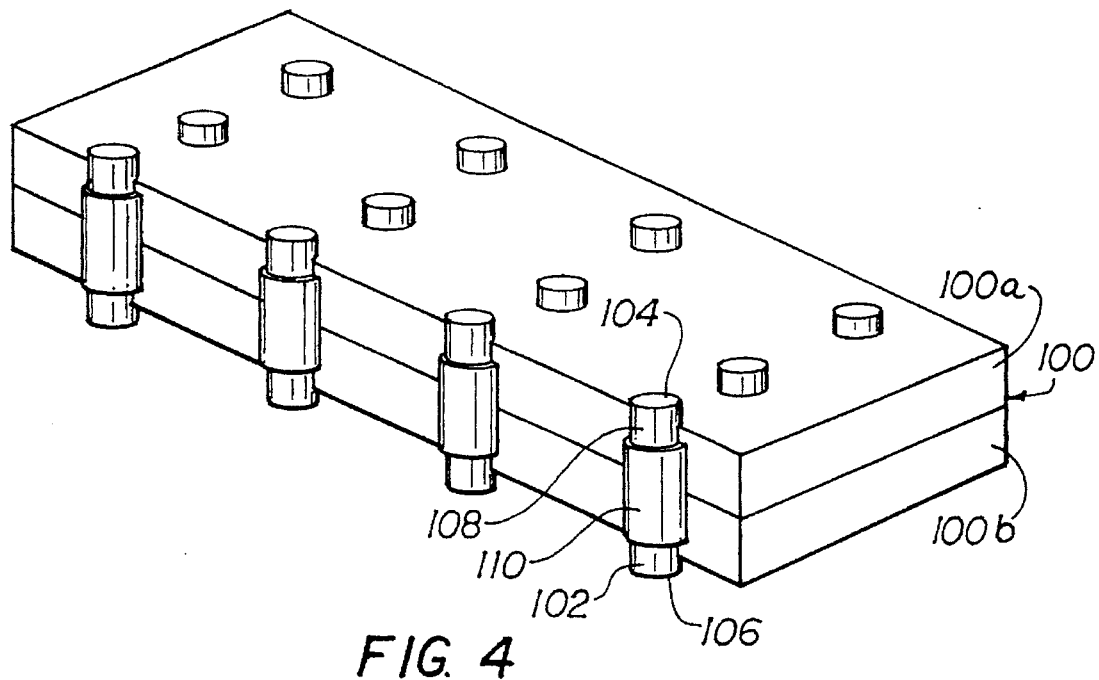
FIG. 4 is a partially cutaway perspective view of an alternative embodiment of the invention.

Another embodiment is illustrated in FIG. 4 which comprises a rigid substrate 100 of electrically insulative material having an array of resilient elements 102 disposed therethrough and arranged in a predetermined configuration to match a contact configuration of devices or circuits to be engaged. Each of the elements 102 have respective contact surfaces 104 and 106 provided by a conductive coating or layer which extends along the wall 108 to provide electrical connection between the contact surfaces. In this embodiment, each element is fully coated with a conductive material, and preferably is metalized by a chemical grafting technique.

The resilient elements 102 can be of different configurations. In FIG. 4, the elements are each of cylindrical configuration having a center portion 110 of enlarged diameter. Each element is retained within a complimentarily shaped cavity or opening in the substrate 100. In FIG. 4, the substrate is provided in two halves 101a and 101b. To assemble the structure illustrated in FIG. 4, the substrate halves are separated and the elements 102 are disposed in their respective openings in lower half 100b, and the upper half 100a is then installed over the elements to complete the assembly. The elements are retained in their respective openings by the enlarged midsections 110. Alternatively, the substrate 100 can be provided as a single piece, with the elements 102 insertable via the top or bottom opening of the cavity, the elements being sufficiently resilient to allow such insertion.

Figure 5:
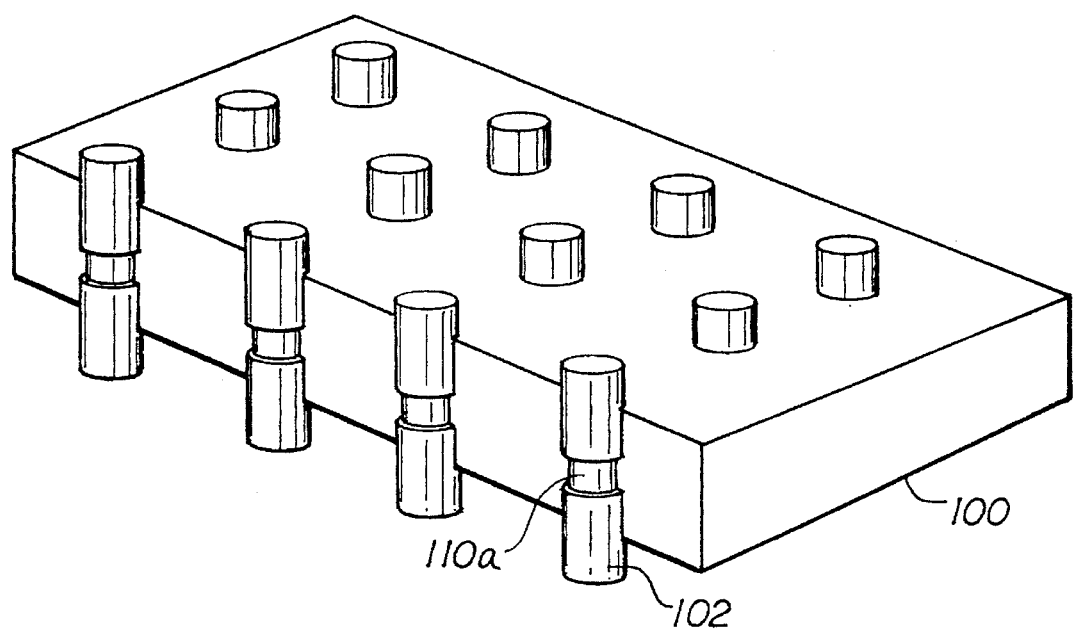
FIG. 5 is a partially cutaway perspective view of a variation of the embodiment of FIG. 4.

Another configuration of elements is illustrated in FIG. 5 wherein the elements 102 have a midsection 110a of reduced diameter. The substrate 100 has cooperatively shaped cavities, and the elements are retained within their respective cavities by the reduced diameter section 110a and cooperative ridge provided in the cavity. The elements are sufficiently resilient to be squeezed and inserted into the respective cavities until fully seated as illustrated.

Figure 6:
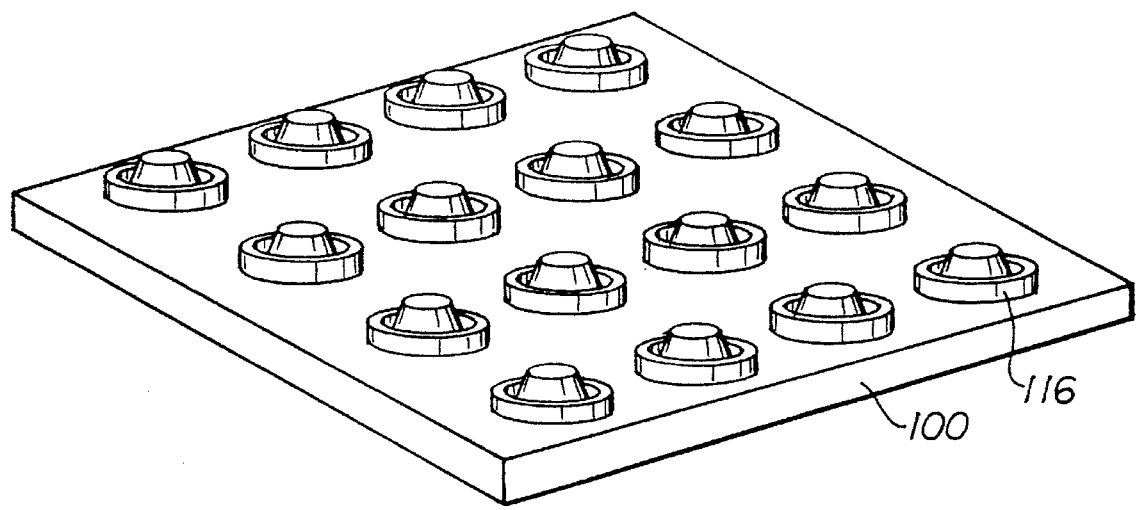
FIG. 6 is a perspective view of another embodiment of the invention.
Figure 7:
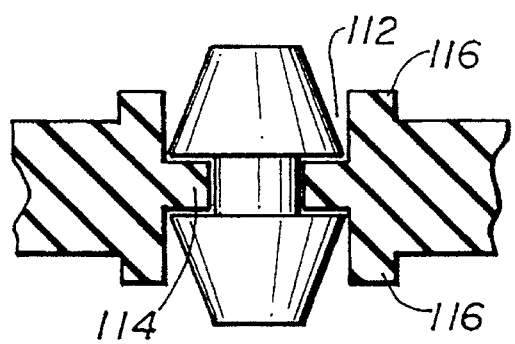
FIG. 7 is a cross sectional view of the embodiment of FIG. 6; embodiment of FIGS. 6 and 7.
Figure 8:
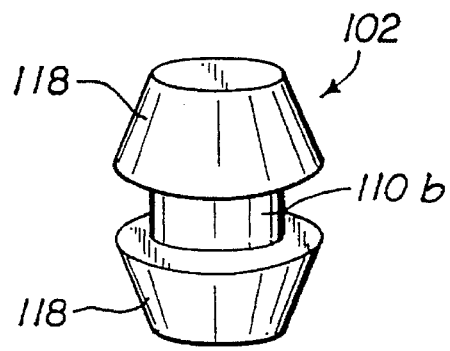

Another embodiment is illustrated in FIGS. 6, 7 and 8. In this embodiment, the substrate 100 has cavities 112 with a centrally disposed ridge or flange 114 and upper and lower collars 116 surrounding the upper and lower openings of each cavity. The conductive elements 102 in this embodiment each include frustoconical upper and lower sections 118 and a reduced cross-section central portion 110b. This central portion 110b is cooperative with the flange 114 of the substrate as seen in FIG. 7 to retain the elements within their respective cavities. The elements are sufficiently resilient to be pushed into their respective cavities and to snap over the flange 114 to be retained thereby.

Figure 9:
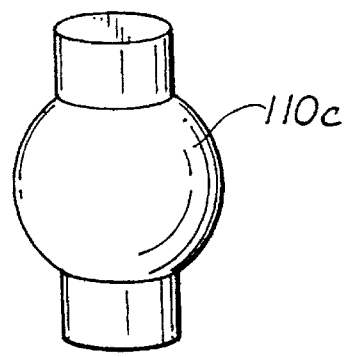
FIGS. 9 through 14 are perspective views of alternative configurations of resilient elements in accordance with the invention.
Figure 10:
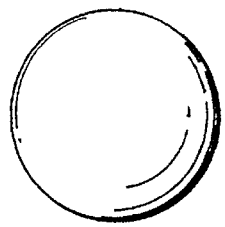
Figure 11:
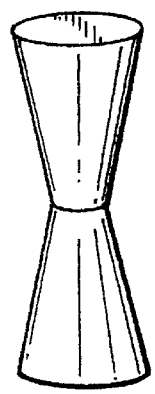
Figure 12:
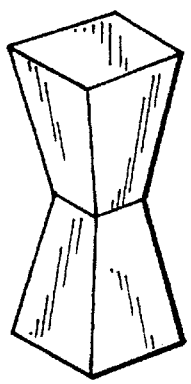
Figure 13:
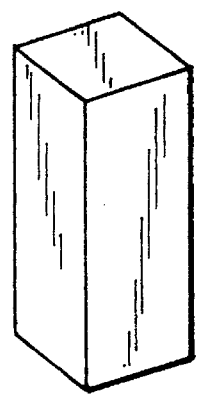

Other exemplary configurations of resilient elements 102 are illustrated in FIGS. 9 through 13. In FIG. 9, the element is of cylindrical configuration having a bulbous or spherical midsection 110c. In FIG. 10, the element is spherical. In FIG. 11, the element has a complimentary frustoconical configuration which flares outward toward the respective ends of the element. In FIG. 12, the element is of multifaceted configuration which outwardly is of rectangular configuration. The substrate for retaining any one configuration of elements has cooperative cavities for retaining the elements within the substrate.

Resilient elements of uniform cross section can be retained in cooperative cavities by sizing the cavities in relation to the elements to provide a fit sufficiently tight to retain the element in intended position within the cavity.

Figure 14:
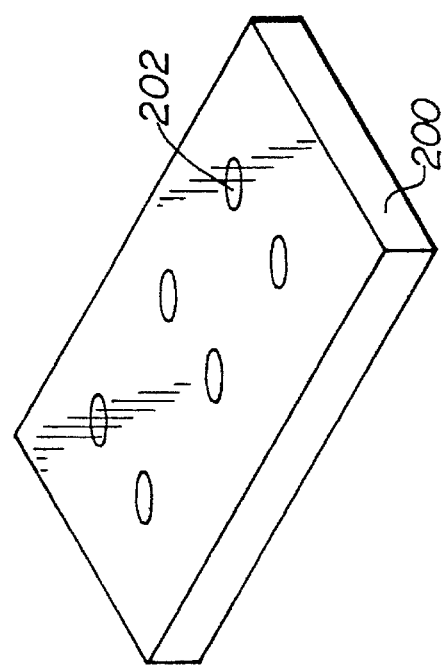

As a further alternative, the resilient elements can be provided with their contact surfaces generally in the corresponding planes of the substrate surface. Referring to FIG. 14, the resilient elements 202 are retained in respective cavities of substrate 200 and their respective contact surfaces are generally coplanar with the respective surfaces of the substrate.

Figure 15:
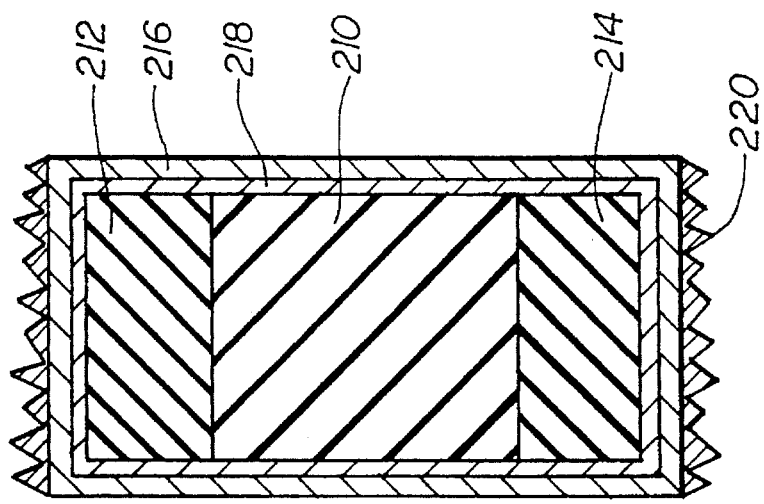
FIG. 15 is a sectional view of a further embodiment of a resilient element according to the invention.
Figure 16:
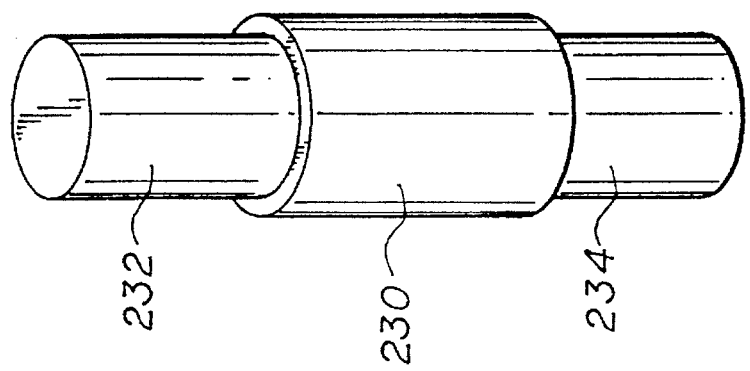
FIG. 16 is a perspective view of yet another embodiment of a resilient element according to the invention.

The resilient elements in the embodiments described above are of a resilient material such as silicon rubber having a single durometer. Thus, each element has an elastomeric core of uniform resilience and about which a conductive coating or layer is provided as described above. Alternatively, the resilient elements can be made with two or more different durometers to provide intended spring or resilience characteristics. For example, as illustrated in FIG. 15, the conductive element has a midsection 210 of durometer different than that of the upper and lower sections 212 and 214. The upper and lower sections may be of the same durometer or of different durometers. For example, the midsection 210 may be of higher durometer, and the end sections 212 and 214 of lower durometer. This construction provides the upper and lower sections 212 and 214 of the element with more flexibility when, for instance, the upper and lower sections 212 and 214 of the element are being forced into and through a mating cavity of a substrate. A conductive plating 216 is provided over a chemically grafted layer 218 on the wall and upper and lower surfaces. Particles 220 are provided on the contact surfaces, as described. Another version of different durometer material is shown in FIG. 16 wherein the center enlarged section 230 is of durometer different than the upper and lower sections 232 and 234.

Having shown the preferred embodiment, those skilled in the art will realize many variations are possible which will still be within the scope and spirit of the claimed invention. Therefore, it is the intention to limit the invention only as indicated by the scope of the claims.

What is claimed is:

1. An electrical interconnect comprising:

an upper substrate having respective opposite substrate surfaces, said upper substrate having one or more cavities formed therein extending between said respective opposite substrate surfaces, said upper substrate being formed of a non-conductive material;

a lower substrate having respective opposite substrate surfaces, said lower substrate having one or more cavities formed therein extending between said respective opposite substrate surfaces, said one or more cavities formed in said lower substrate being located so as to be aligned with said one or more cavities formed in said upper substrate when said upper substrate and said lower substrate are joined, said lower substrate being formed of a non-conductive material; and one or more resilient elements each having respective opposite contact surfaces disposed outward from said respective opposite substrate surfaces of said upper and lower substrates, said one or more resilient elements being formed of a non-conductive material, each of said one or more resilient elements having a flexible conductive layer disposed over said respective opposite contact surfaces and extending along at least a portion of a wall of said one or more resilient elements between said respective opposite contact surfaces so as to electrically connect said respective opposite contact surfaces, said one or more resilient elements being retained within said one or more cavities when said upper and lower substrates are joined.

2. The electrical interconnect as defined in claim 1, wherein each of said one or more resilient elements has a articulate layer of homogeneous conductive particles disposed over said flexible conductive layer on said respective opposite contact surfaces so as to penetrate an oxide layer formed on an electrical contact coming into engagement with said one or more resilient elements.

3. An electrical interconnect element comprising:

a resilient element of non-conductive resilient material having upper, middle, and lower sections with said upper and lower sections providing respective opposite contact surfaces, said non-conductive resilient material having a different durometer in said middle section than in said upper and lower sections, said resilient element having a flexible conductive layer disposed over said respective opposite contact surfaces and extending along at least a portion of a wall of said resilient element between said respective opposite contact surfaces so as to electrically connect said respective opposite contact surfaces.

4. The electrical interconnect element as defined in claim 3, wherein said resilient element has a particulate layer of homogeneous conductive particles disposed over said flexible conductive layer on said respective opposite contact surfaces so as to penetrate an oxide layer formed on an electrical contact coming into engagement with said one or more resilient elements.

\* \* \* \* \*

UNITED STATES PATENT AND TRADEMARK OFFICE
CERTIFICATE OF CORRECTION

PATENT NO.   : 5,599,193
DATED        : February 4, 1997
INVENTOR(S)  : David R. Crotzer It is certified that error appears in the above-identified patent and that said Letters Patent is hereby corrected as shown below:

In column 3, line 15, "6; embodiment of FIGS. 6 and 7;" should read --6;

FIG. 8 is a perspective view of a resilient element of the embodiment of FIGS. 6 and 7;--

In column 6, line 38 (claim 2), "articulate" should read --particulate--

Signed and Sealed this

Twenty-ninth Day of February, 2000

Attest:

Q. TODD DICKINSON

Attesting Officer

Commissioner of Patents and Trademarks